US010529598B2

(12) United States Patent
Hong et al.

(10) Patent No.: US 10,529,598 B2
(45) Date of Patent: Jan. 7, 2020

(54) MICROWAVE HEAT TREATMENT APPARATUS AND MICROWAVE HEAT TREATMENT METHOD

(71) Applicant: TOKYO ELECTRON LIMITED, Tokyo (JP)

(72) Inventors: Seokhyoung Hong, Nirasaki (JP);
Taichi Monden, Nirasaki (JP);
Yoshihiro Miyagawa, Nirasaki (JP);
Masaki Koizumi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1104 days.

(21) Appl. No.: 14/550,065

(22) Filed: Nov. 21, 2014

(65) Prior Publication Data

US 2015/0144622 A1 May 28, 2015

(30) Foreign Application Priority Data

Nov. 27, 2013 (JP) .................................. 2013-244684

(51) Int. Cl.
*H01L 21/67* (2006.01)
*H05B 6/64* (2006.01)

(52) U.S. Cl.
CPC .. *H01L 21/67109* (2013.01); *H01L 21/67115* (2013.01); *H05B 6/642* (2013.01)

(58) Field of Classification Search
CPC ......... H01L 21/67109; H01L 21/67115; H01L 21/26; H05B 6/6411; H05B 6/642; H05B 6/806; H05B 6/80

USPC ........................................................ 219/754
See application file for complete search history.

(56) References Cited

U.S. PATENT DOCUMENTS

| 8,513,574 B2 * | 8/2013 | Yokouchi | F27B 17/0025 |
| | | | 118/50.1 |
| 9,224,623 B2 * | 12/2015 | Kasai | H01L 21/67017 |
| 2006/0286807 A1 * | 12/2006 | Hwang | H01L 21/67115 |
| | | | 438/715 |

(Continued)

FOREIGN PATENT DOCUMENTS

| JP | 04-005822 A | | 1/1992 |
| JP | 2000-100742 A | | 4/2000 |
| JP | 2000100742 A | * | 4/2000 |

(Continued)

*Primary Examiner* — Theodore J Stigell
*Assistant Examiner* — Spencer H. Kirkwood
(74) *Attorney, Agent, or Firm* — Nath, Goldberg & Meyer; Jerald L. Meyer

(57) ABSTRACT

A microwave heat treatment apparatus includes: a processing vessel configured to accommodate a substrate therein; a support member configured to rotatably support the substrate in the processing vessel; a microwave introduction device configured to generate a microwave for processing the substrate and introduce the microwave into the processing vessel; a first cooling gas introduction part installed to face a main surface of the substrate supported by the support member, the main surface being a target to be processed; a second cooling gas introduction part installed in a lateral side of the substrate supported by the support member; and a control unit configured to independently control the introduction of a cooling gas from the first cooling gas introduction part and the introduction of the cooling gas from the second cooling gas introduction part.

11 Claims, 9 Drawing Sheets

(56) References Cited

U.S. PATENT DOCUMENTS

2007/0010072 A1\* 1/2007 Bailey ................... C23C 16/308
      438/478

FOREIGN PATENT DOCUMENTS

| JP | 2000-286267 | A |   | 10/2000 | |
|----|-------------|---|---|---------|---|
| JP | 2000286267  | A | \* | 10/2000 | ....... H01L 21/67109 |
| JP | 2009-260025 | A |   | 11/2009 | |
| JP | 2010-196102 | A |   | 9/2010  | |
| JP | 2013-073947 | A |   | 4/2013  | |
| JP | 2013-152919 | A |   | 8/2013  | |
| KR | 10-2012-0096892 | A | | 8/2012 | |

\* cited by examiner

MICROWAVE HEAT TREATMENT APPARATUS AND MICROWAVE HEAT TREATMENT METHOD

CROSS-REFERENCE TO RELATED APPLICATION

This application claims the benefit of Japanese Patent Application No. 2013-244684, filed on Nov. 27, 2013, in the Japan Patent Office, the disclosure of which is incorporated herein in its entirety by reference.

TECHNICAL FIELD

The present disclosure relates to a microwave heat treatment apparatus that performs a predetermined process on a substrate by introducing a microwave into a processing vessel, and a microwave heat treatment method for use in the microwave heat treatment apparatus to irradiate the substrate with the microwave.

BACKGROUND

Recently, an apparatus using a microwave has been proposed as an apparatus for performing a heat treatment on a substrate such as a semiconductor wafer. The heat treatment using a microwave is known to have a great process advantage, as compared with a conventional annealing apparatus using lamp or resistance heating, in that internal heating, local heating, and selective heating can be achieved. For example, when the microwave heating is used to activate doping atoms, there are advantages in that excessive heating does not occur and a diffusion layer can be restrained from expanding because the microwave directly acts on the doping atoms. In addition, the heating using microwave irradiation advantageously allows an annealing process at a relatively low temperature and thus restrains thermal budget from being increased as compared with the conventional lamp or resistance heating manner. However, since a microwave has a long wavelength of several tens of millimeters and further has characteristics of easily forming a standing wave in a processing vessel, a distribution of strong and weak electromagnetic fields may be generated in a substrate plane and non-uniformity of heating temperature may thus occur in some cases. Therefore, it is difficult to control a temperature of the entire substrate only by using an output of the microwave, and thus, in order to prevent the occurrence of an excessive temperature distribution, an annealing process considering a balance between cooling and heating by using the microwave is considered as being necessary.

In order to cool the substrate, which is being heated or has been heated by microwave irradiation, in the processing vessel of the microwave heat treatment apparatus, a gas cooling method in which a cooling gas is introduced into the processing vessel may be contemplated. For example, there has been proposed a heat treatment apparatus, in which a flow rate of air injected from an injection plate installed in a lower portion of a processing vessel is changed for each of a plurality of regions to improve uniformity of an in-plane temperature distribution of the substrate. In addition, although a temperature control of a substrate is not an objective, there has been proposed a vapor deposition apparatus configured to independently control an amount of a purge gas injected from a shower head, which is installed in an upper portion of a processing vessel facing the substrate, for each of a plurality of regions.

SUMMARY

Some embodiments of the present disclosure provide a microwave heat treatment apparatus and a microwave heat treatment method wherein a substrate is heated using microwaves while maximizing an in-plane uniformity of a temperature distribution in a substrate.

According to an aspect of the present disclosure, there is provided a microwave heat treatment apparatus, including: a processing vessel configured to accommodate a substrate therein; a support member configured to rotatably support the substrate in the processing vessel; a microwave introduction device configured to generate a microwave for processing the substrate and introduce the microwave into the processing vessel; a first cooling gas introduction part installed to face a main surface of the substrate supported by the support member, the main surface being a target to be processed; a second cooling gas introduction part installed in a lateral side of the substrate supported by the support member; and a control unit configured to independently control the introduction of a cooling gas from the first cooling gas introduction part and the introduction of the cooling gas from the second cooling gas introduction part.

According to another aspect of the present disclosure, there is provided a microwave heat treatment method for performing a heat treatment on a substrate, which is supported by a support member in a processing vessel, by irradiating the substrate with a microwave, the method including: rotating and irradiating the substrate with a microwave in the processing vessel: injecting a first cooling gas toward a main surface of the substrate supported by the support member from a position facing the main surface, the main surface being a target to be processed; and injecting a second cooling gas in a direction parallel with the main surface of the substrate supported by the support member from a lateral side of the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described in detail with reference to the drawings.

Figure 1:
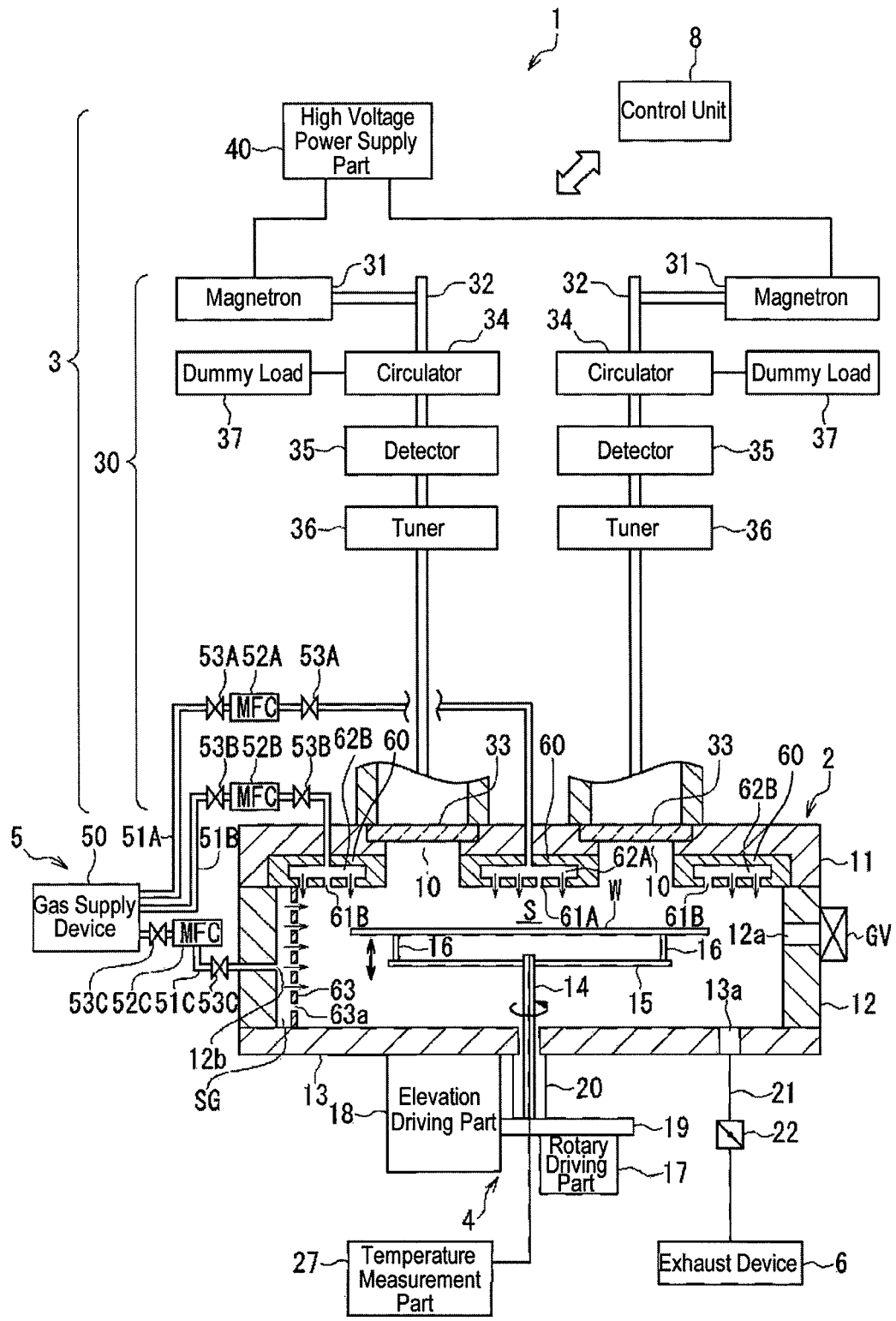
FIG. 1 is a sectional view showing a schematic configuration of a microwave heat treatment apparatus according to one embodiment of the present disclosure.
Figure 2:
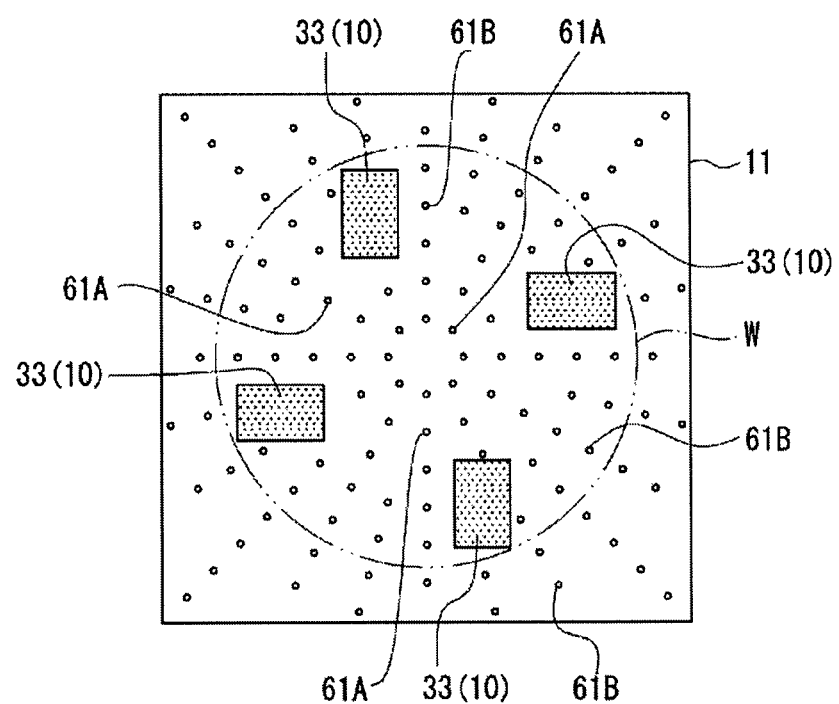
FIG. 2 is a bottom view showing a bottom surface of a ceiling portion of a processing vessel shown in FIG. 1.

First, referring to FIG. 1, a schematic configuration of a microwave heat treatment apparatus according to an embodiment of the present disclosure will be described. FIG. 1 is a sectional view showing the schematic configuration of the microwave heat treatment apparatus according to the present embodiment. FIG. 2 is a bottom view showing a bottom surface of a ceiling portion of a processing vessel shown in FIG. 1. A microwave heat treatment apparatus 1 according to the present embodiment is an apparatus for performing an annealing process by irradiating a microwave on a semiconductor wafer (hereinafter, simply referred to as "wafer") W, for example, for manufacturing semiconductor devices, along with a series of operations. Here, among wide-area upper and lower surfaces of the flat plate-shaped wafer W, the upper surface is a surface on which semiconductor devices are formed. The upper surface is a main surface which is a target to be processed.

The microwave heat treatment apparatus 1 includes a processing vessel 2 configured to accommodate a wafer W as an object to be processed therein, a microwave introduction device 3 configured to introduce a microwave into the processing vessel 2, a support device 4 configured to support the wafer W in the processing vessel 2, a gas supply mechanism 5 configured to supply a gas into the processing vessel 2, an exhaust device 6 configured to depressurize and exhaust the interior of the processing vessel 2, and a control unit 8 configured to control the respective components of the microwave heat treatment apparatus 1.

<Processing Vessel>

The processing vessel 2 is formed of a metal reflective of the microwave. The material forming the processing vessel 2 includes, for example, aluminum, aluminum alloy and the like.

The processing vessel 2 includes a plate-shaped ceiling portion 11 as an upper wall, a bottom portion 13 as a bottom wall, a polygonal cylindrical sidewall portion 12 connecting the ceiling portion 11 and the bottom portion 13, a plurality of microwave introduction ports 10 installed to pass through the ceiling portion 11 in a vertical direction, a loading/unloading port 12a formed in the sidewall portion 12, and an exhaust port 13a formed in the bottom portion 13. Alternatively, the sidewall portion 12 may be in the shape of a circular cylinder. The loading/unloading port 12a is to allow the wafer W to be loaded or unloaded between the processing vessel 2 and a transfer chamber (not shown) adjacent thereto. A gate valve GV is installed between the processing vessel 2 and the transfer chamber (not shown). The gate valve GV has a function of opening and closing the loading/unloading port 12a, thereby enabling the processing vessel 2 to be airtightly sealed in a closed state and the wafer W to be transferred between the processing vessel 2 and the transfer chamber (not shown) in an open state.

<Support Device>

The support device 4 includes a pipe-shaped shaft 14 penetrating through an approximately central portion of the bottom portion 13 of the processing vessel 2 and extending to the outside of the processing vessel 2, an arm portion 15 horizontally installed in the vicinity of the upper end of the shaft 14, and a plurality of support pins 16 as support members detachably mounted to the arm portion 15. In addition, the support device 4 includes a rotary driving part 17 configured to rotate the shaft 14, an elevation driving part 18 configured to move the shaft 14 up and down, and a movable connection portion 19 configured to support the shaft 14 and to connect the rotary driving part 17 and the elevation driving part 18. The rotary driving part 17, the elevation driving part 18 and the movable connection portion 19 are installed outside the processing vessel 2. Further, in order to put the processing vessel 2 in a vacuum state, a sealing mechanism 20 such as bellows may be installed around the portion where the shaft 14 penetrates through the bottom portion 13.

The plurality (three in this embodiment) of support pins 16 is brought into contact with the rear surface of the wafer W to support the wafer W in the processing vessel 2. The plurality of support pins 16 is installed such that the upper ends thereof are arranged in the circumferential direction of the wafer W. Each of the support pins 16 is detachably mounted to the arm portion 15. The plurality of support pins 16 and the arm portion 15 are formed of a dielectric material. The dielectric material forming the plurality of support pins 16 and the arm portion 15 may include, for example, quartz, ceramics, and the like. In addition, the number of support pins 16 is not limited to three as long as the support pins can stably support the wafer W.

In the support device 4, the shaft 14, the arm portion 15, the rotary driving part 17 and the movable connection portion 19 constitute a rotary mechanism configured to horizontally rotate the wafer W supported by the support pins 16. The plurality of support pins 16 and the arm portion 15 are rotated around the shaft 14 as a rotation center by driving the rotary driving part 17, and the respective support pins 16 are horizontally, circularly moved (revolved) to rotate the wafer W supported thereon. In addition, in the support device 4, the shaft 14, the arm portion 15, the elevation driving part 18 and the movable connection portion 19 constitute a level position adjustment mechanism configured to adjust the level position of the wafer W supported by the support pins 16. The plurality of support pins 16 and the arm portion 15 are configured to be vertically moved up and down, along with the shaft 14, by driving the elevation driving part 18. Further, in the microwave heat treatment apparatus 1, the elevation driving part 18 and the movable connection portion 19 are optional configurations and may not be installed.

The rotary driving part 17 is not specifically limited if it can rotate the shaft 14, and may include, for example, a motor (not shown) or the like. The elevation driving part 18 is not specifically limited if it can move the shaft 14 and the movable connection portion 19 up and down, and may include, for example, a ball screw (not shown) or the like. The rotary driving part 17 and the elevation driving part 18 may be an integrated mechanism and may be configured not to have the movable connection portion 19. In addition, the rotary mechanism configured to horizontally rotate the wafer W and the level position adjustment mechanism configured to adjust the level position of the wafer W may have other configurations if they can realize their objectives, respectively.

<Exhaust Mechanism>

The exhaust device 6 has, for example, a vacuum pump, such as a dry pump. The microwave heat treatment apparatus 1 also includes an exhaust pipe 21 configured to connect the exhaust port 13a and the exhaust device 6, and a pressure adjustment valve 22 installed in the middle of the exhaust pipe 21. By operating the vacuum pump of the exhaust device 6, the internal space of the processing vessel 2 is decompressed and exhausted. In addition, the microwave heat treatment apparatus 1 may perform a process under atmospheric pressure, and in such a case, the vacuum pump is unnecessary. Instead of using the vacuum pump such as a dry pump as the exhaust device 6, exhaust equipment installed in the plant in which the microwave heat treatment apparatus 1 is installed may be used.

<Gas Supply Mechanism>

The microwave heat treatment apparatus 1 also includes the gas supply mechanism 5 configured to supply a gas into the processing vessel 2. The gas supply mechanism 5 includes a gas supply device 50 having a plurality of gas supply sources (not shown), and a plurality of pipes (here, only three pipes 51A, 51B and 51C are shown) connected to the gas supply device 50 and configured to introduce a cooling gas into the processing vessel 2. The two pipes 51A and 51B are connected to the ceiling portion 11 of the processing vessel 2. Pipe 51C is connected to the sidewall portion 12 of the processing vessel 2.

The gas supply mechanism 5 also includes a mass flow controller (MFC) and one or a plurality of opening/closing valves (only two valves are shown), which are installed in the middle of each of the pipes 51A, 51B and 51C. The mass flow controller (MFC) 52A and the two opening/closing valves 53A are arranged in the middle of the pipe 51A. The mass flow controller (MFC) 52B and the two opening/closing valves 53B are arranged in the middle of the pipe 51B. The mass flow controller (MFC) 52C and the two opening/closing valves 53C are arranged in the middle of the pipe 51C. A flow rate of the cooling gas supplied into the processing vessel 2 or an on/off switching of the cooling gas supply into the processing vessel 2 is controlled by the mass flow controllers 52A, 52B and 52C and the opening/closing valves 53A, 53B and 53C.

<First Cooling Gas Introduction Part>

The gas supply mechanism 5 is configured such that the cooling gas for cooling the wafer W can be supplied into the processing vessel 2 from the gas supply device 50 through the pipes 51A and 51B and a shower head 60. The shower head 60 is a first cooling gas introduction part installed to face the main surface of the wafer W supported by the support device 4. The shower head 60 introduces a face flow of the cooling gas toward the main surface of the wafer W. The shower head 60 is mounted in the ceiling portion 11 to face the wafer W. The cooling gas introduced into the processing vessel 2 from the shower head 60 forms a first cooling gas flow injected from the position facing the main surface of the wafer W supported by the support device 4 toward the main surface of the wafer W.

The shower head 60 includes a plurality of gas holes 61A, a gas diffusion chamber 62A in communication with the plurality of gas holes 61A, a plurality of gas holes 61B, and a gas diffusion chamber 62B in communication with the plurality of gas holes 61B. The gas diffusion chamber 62A is connected to the pipe 51A. The gas diffusion chamber 62A is installed in the central portion of the shower head 60 to face a region of the central portion of the wafer W. Thus, the plurality of gas holes 61A in communication with the gas diffusion chamber 62A are arranged such that the cooling gas can be injected toward the central portion of the wafer W. In the meantime, the gas diffusion chamber 62B is connected to the pipe 51B. The gas diffusion chamber 62B is installed in the peripheral portion of the shower head 60 to face a region of the edge portion of the wafer W. Therefore, the plurality of gas holes 61B in communication with the gas diffusion chamber 62B are arranged such that the cooling gas can be injected toward the edge portion of the wafer W. Here, the central portion of the wafer W means a region within a range of about one third of the diameter of the wafer W including the center thereof, and the edge portion means a region outside of the central portion, i.e., a region within a range from the peripheral portion of the wafer W to about one third of the diameter of the wafer W in the inward direction (two thirds of the wafer W in total in the diameter direction). For example, for the circular wafer W having a diameter of 300 mm, a region from the center of the wafer W to a 50 mm radius is the central portion, and a region beyond the 50 mm radius from the center to the periphery (the 150 mm radius) of the wafer W is the edge portion.

The gas diffusion chamber 62A is arranged in the inner portion of the shower head 60, and the gas diffusion chamber 62B is arranged in the outer portion of the shower head 60 to surround the gas diffusion chamber 62A. In this way, the shower head 60 is configured to arrange the gas diffusion chambers 62A and 62B in two inner and outer zones, respectively, such that the cooling gas can be independently introduced into the processing vessel 2 from the respective gas diffusion chambers 62A and 62B. That is, the cooling gas may be injected only to the central portion of the wafer W through the pipe 51A, the gas diffusion chamber 62A and the gas holes 61A at a predetermined flow rate, or the cooling gas may be injected only to the edge portion of the wafer W through the pipe 51B, the gas diffusion chamber 62B and the gas holes 61B at another predetermined flow rate. Of course, the cooling gas may be simultaneously introduced both through the pipe 51A and the gas diffusion chamber 62A and through the pipe 51B and the gas diffusion chamber 62B. In this case, the flow rate of the cooling gas injected to the central portion of the wafer W through the pipe 51A and the gas diffusion chamber 62A and the flow rate of the cooling gas injected to the edge portion of the wafer W through the pipe 51B and the gas diffusion chamber 62B may be the same to or different from each other. For example, when a temperature of the edge portion is relatively lower than that of the central portion in a plane of the main surface (hereinafter, simply referred as "in-plane") of the wafer W, an in-plane temperature distribution of the wafer W can be made uniform by stopping the injection of the cooling gas from the gas holes 61B or restraining the flow rate thereof to thereby relatively decrease the cooling in the edge portion (relatively increase the cooling in the central portion). The switching of the introduction of the cooling gas to the gas diffusion chamber 62A and the gas diffusion chamber 62B can be performed by opening or closing the opening/closing valves 53A and 53B installed in the pipes 51A and 51B, respectively. In addition, the number of gas diffusion chambers installed in the shower head 60 is not limited to two and may be one or three or more. In addition, the arrangement of the gas diffusion chambers is not limited to the configuration having the chambers arranged in the diameter direction of the wafer W and, for example, a plurality of gas diffusion chambers may be arranged in parallel in a grid shape.

<Second Cooling Gas Introduction Part>

A gas introduction port 12b is formed in the portion where the pipe 51C and the sidewall portion 12 of the processing vessel 2 are connected. The gas introduction port 12b is a second cooling gas introduction part installed in a lateral side of the wafer W supported by the support device 4. The gas supply mechanism 5 is configured to supply a side flow of the cooling gas into the processing vessel 2 from the gas supply device 50 through the pipe 51C and the gas introduction port 12b. That is, the cooling gas introduced into the processing vessel 2 through the gas introduction port 12b forms a second cooling gas flow injected from the lateral side of the wafer W supported by the support device 4 in the direction parallel with the main surface of the wafer W. Further, in the vicinity of the sidewall portion 12 having the gas introduction port 12b, a shower plate 63 as a gas dispersion plate is arranged in order to uniformly disperse the gas flow injected from the gas introduction port 12b. The shower plate 63 is made of, for example, a metal such as aluminum or aluminum alloy. The plate-shaped shower plate 63 has a plurality of gas injection holes 63a as a plurality of through holes. The shower plate 63 is installed approximately in parallel with the inner wall surface of the sidewall portion 12 of the processing vessel 2 to face the gas introduction port 12b. A diffusion space SG for diffusing the cooling gas introduced from the gas introduction port 12b is defined between the shower plate 63 and the sidewall portion 12. The cooling gas injected from the gas introduction port 12b is diffused in the diffusion space SG and then uniformly supplied into a microwave radiation space S through the plurality of gas injection holes 63a of the shower plate 63. The shower plate 63 is an optional configuration and may not be installed.

In the microwave heat treatment apparatus 1 of the present embodiment, the cooling gas may include, for example, an inert gas such as $N_2$, Ar, He, Ne and Xe. Further, although not shown, the gas supply device 50 may include gas supply sources and pipes of various gases, other than the cooling gas, such as processing gases for processing the wafer W or a purge gas for purging the processing vessel 2. In addition, instead of the gas supply device 50, an external gas supply device which is not included in the microwave heat treatment apparatus 1 may be used.

Temperature Measurement Part>

The microwave heat treatment apparatus 1 also includes a plurality of radiation thermometers (not shown) for measuring surface temperatures of the wafer W, and a temperature measurement part 27 connected to the radiation thermometers. The temperature measurement part 27 transmits surface temperatures at a plurality of locations in the plane of the wafer W to the control unit 8 in real time.

<Microwave Radiation Space>

In the microwave heat treatment apparatus 1 of the present embodiment, the microwave radiation space S is defined in the processing vessel 2. Microwaves are emitted into the microwave radiation space S from the plurality of microwave introduction ports 10 installed in the ceiling portion 11. Since the ceiling portion 11, the sidewall portion 12 and the bottom portion 13 of the processing vessel 2 all are formed of a metal, the microwave is reflected and scattered in the microwave radiation space S.

<Microwave Introduction Device>

Figure 3:
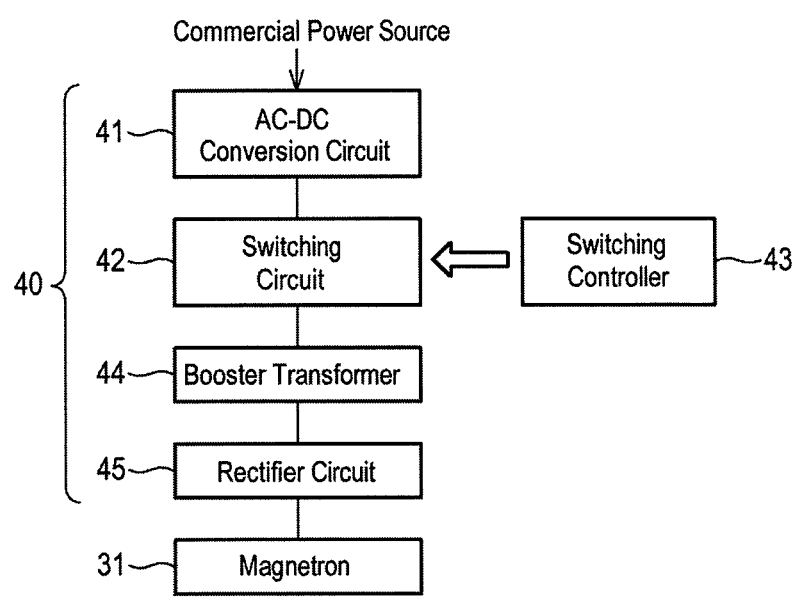
FIG. 3 is a view illustrating a schematic configuration of a high-voltage power supply part of a microwave introduction device according to one embodiment of the present disclosure.

Then, referring to FIGS. 1, 2 and 3, the configuration of the microwave introduction device 3 will be described. FIG. 3 is a view illustrating a schematic configuration of a high voltage power supply part of the microwave introduction device 3.

The microwave introduction device 3 is installed on top of the processing vessel 2 and functions as a microwave introduction means configured to introduce electromagnetic waves (microwaves) into the processing vessel 2. As shown in FIG. 1, the microwave introduction device 3 includes a plurality of microwave units 30 configured to introduce microwaves into the processing vessel 2, and a high voltage power supply part 40 connected to the plurality of microwave units 30.

<Microwave Unit>

In the present embodiment, the plurality of microwave units 30 has the same configuration. Each of the microwave units 30 includes a magnetron 31 configured to generate a microwave for processing the wafer W, a waveguide 32 configured to transmit the microwave generated from the magnetron 31 to the processing vessel 2, and a transmission window 33 fixed to the ceiling portion 11 to block the microwave introduction port 10. The magnetron 31 corresponds to a microwave source in the present disclosure.

As shown in FIG. 2, in the present embodiment, the processing vessel 2 has four microwave introduction ports 10 arranged in the ceiling portion 11 at equal intervals in the circumferential direction. Each of the microwave introduction ports 10 is shaped in a rectangle having long and short sides as viewed from the top. Although the respective microwave introduction ports 10 may be different from one another in a size or a ratio between the long and short sides thereof, the four microwave introduction ports 10 may have the same size and shape in order to improve the controllability as well as uniformity of an annealing process on the wafer W. Further, in the present embodiment, each of the microwave introduction ports 10 is connected to one of the corresponding microwave units 30. That is, the number of microwave units 30 is four.

The magnetron 31 has an anode and a cathode (both not shown) to which a high voltage supplied by the high voltage power supply part 40 is applied. In addition, the magnetron 31 may include those capable of generating microwaves of various frequencies. An optimal frequency may be selected for each substrate processing. For example, the microwave generated by the magnetron 31 for an annealing process may have a high frequency of 2.45 GHz, 5.8 GHz or the like, and in some embodiments, may have a frequency of 5.8 GHz.

The waveguide 32 has a cylindrical shape with a quadrangular or other polygonal cross section, and extends upward from the upper surface of the ceiling portion 11 of the processing vessel 2. The magnetron 31 is connected in the vicinity of the upper end of the waveguide 32. The lower end of the waveguide 32 adjoins the upper surface of the transmission window 33. The microwave generated in the magnetron 31 is introduced into the processing vessel 2 through the waveguide 32 and the transmission window 33.

The transmission window 33 is formed of a dielectric material. The material of the transmission window 33 may include, for example, quartz, ceramics, and the like. A gap between the transmission window 33 and the ceiling portion 11 is airtightly sealed by a sealing member (not shown). In order to restrain the wafer W from being directly irradiated with the microwave, a distance from the bottom surface of the transmission window 33 to the surface of the wafer W supported by the support pins 16 may be, for example, 25 mm or more, and in some embodiments, may be variably controlled within a range of 25 to 50 mm.

Each of the microwave units 30 also has a circulator 34, a detector 35 and a tuner 36, which are installed in the middle of the waveguide 32, and a dummy load 37 connected to the circulator 34. The circulator 34, the detector 35 and the tuner 36 are installed in this order from an upper end side of the waveguide 32. The circulator 34 and the dummy load 37 constitute an isolator configured to separate a wave reflected from the processing vessel 2. That is, the circulator 34 guides the wave reflected from the processing vessel 2 to the dummy load 37, and the dummy load 37 converts the wave guided by the circulator 34 into heat.

The detector 35 detects the wave reflected from the processing vessel 2 into the waveguide 32. The detector 35 is configured, for example, with an impedance monitor, specifically, a standing wave monitor configured to detect an electric field of a standing wave in the waveguide 32. The standing wave monitor may be configured, for example, with three pins protruding in the internal space of the waveguide 32. By detecting an electric field location, a phase and strength of the standing wave through the use of the standing wave monitor, the wave reflected from the processing vessel 2 can be detected. In addition, the detector 35 may be configured with a directional coupler capable of detecting a traveling wave and a reflected wave.

The tuner 36 has a function of impedance matching between the magnetron 31 and the processing vessel 2. The impedance matching by the tuner 36 is performed based on a detection result of the reflected wave in the detector 35. The tuner 36 may be configured, for example, with a conductor plate (not shown) installed so as to be allowed to enter or exit from the internal space of the waveguide 32. In this case, by adjusting the protrusion amount of the conductor plate into the internal space of the waveguide 32, the energy of the reflected wave can be controlled so that the impedance between the magnetron 31 and the processing vessel 2 can be adjusted.

<High Voltage Power Supply Part>

The high voltage power supply part 40 supplies a high voltage for generating a microwave to the magnetrons 31. As shown in FIG. 3, the high voltage power supply part 40 includes an AC-DC conversion circuit 41 connected to a commercial power source, a switching circuit 42 connected to the AC-DC conversion circuit 41, a switching controller 43 configured to control the operation of the switching circuit 42, a booster transformer 44 connected to the switching circuit 42, and a rectifier circuit 45 connected to the booster transformer 44. The magnetron 31 is connected to the booster transformer 44 through the rectifier circuit 45.

The AC-DC conversion circuit 41 is a circuit configured to rectify an AC power (for example, three-phase 200 V AC) from the commercial power source and convert it to a DC power of a predetermined waveform. The switching circuit 42 is a circuit configured to on/off control the DC power converted by the AC-DC conversion circuit 41. In the switching circuit 42, a phase shift type of PWM (Pulse Width Modulation) control or PAM (Pulse Amplitude Modulation) control is performed by the switching controller 43, thereby generating a voltage waveform in a pulse shape. The booster transformer 44 is to boost the voltage waveform output from the switching circuit 42 to a predetermined amplitude. The rectifier circuit 45 is a circuit configured to rectify the voltage boosted by the booster transformer 44 and supply it to the magnetrons 31.

<Control Unit>

Figure 4:
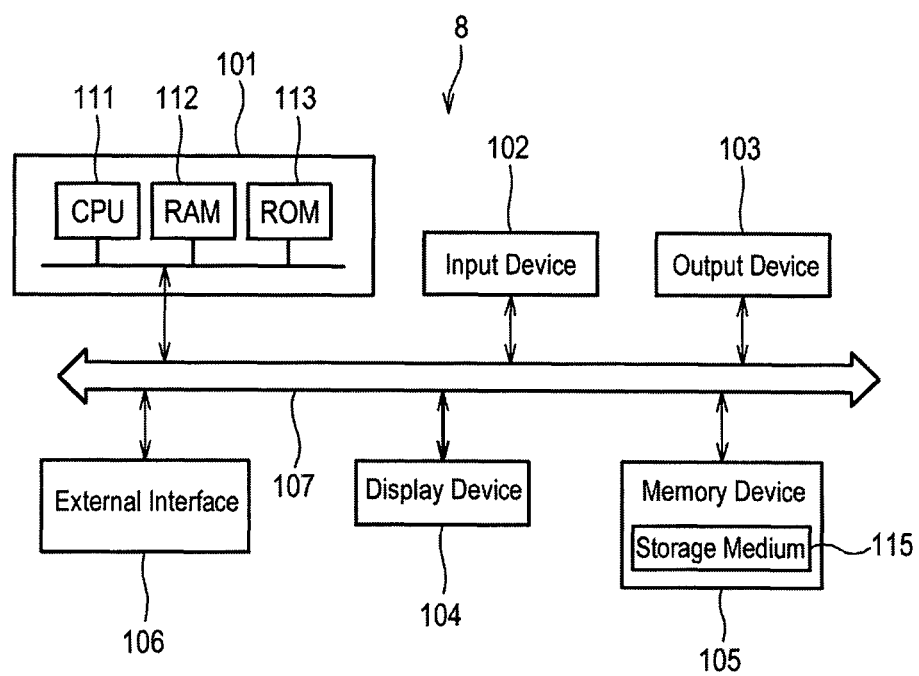
FIG. 4 is a block diagram showing a hardware configuration of a control unit.

The respective components of the microwave heat treatment apparatus 1 are connected to the control unit 8 and controlled by the control unit 8. The control unit 8 is typically a computer. FIG. 4 shows an example of a hardware configuration of the control unit 8 shown in FIG. 1. The control unit 8 includes a main control unit 101, an input device 102 such as a keyboard or a mouse, an output device 103 such as a printer, a display device 104, a memory device 105, an external interface 106, and a bus 107 connecting them. The main control unit 101 has a CPU (Central Processing Unit) 111, a RAM (Random Access Memory) 112 and a ROM (Read Only Memory) 113. Although any type of the memory device 105 may be used if information can be stored therein, the memory device 105 is, for example, a hard disc device or optical disc device. In addition, the memory device 105 records information in a computer-readable storage medium 115, and also reads the information from the storage medium 115. Although any type of the storage medium 115 may be used if information can be stored therein, the storage medium 115 is, for example, a hard disc, an optical disc, a flash memory or the like. The storage medium 115 may be a storage medium storing a recipe of a microwave heat treatment method according to the present embodiment.

As the CPU 111 uses the RAM 112 as a work area and executes the program stored in the ROM 113 or the memory device 105, the control unit 8 allows the heat treatment to be performed on the wafer W in the microwave heat treatment apparatus 1 of the present embodiment. Specifically, in the microwave heat treatment apparatus 1, the control unit 8 controls the respective components (for example, the microwave introduction device 3, the support device 4, the gas supply device 50, the exhaust device 6 and the like) in relation to process conditions such as a temperature of the wafer W, an internal pressure of the processing vessel 2, a flow rate of the cooling gas, microwave output, a rotational speed of the wafer W and the like.

Figure 5:
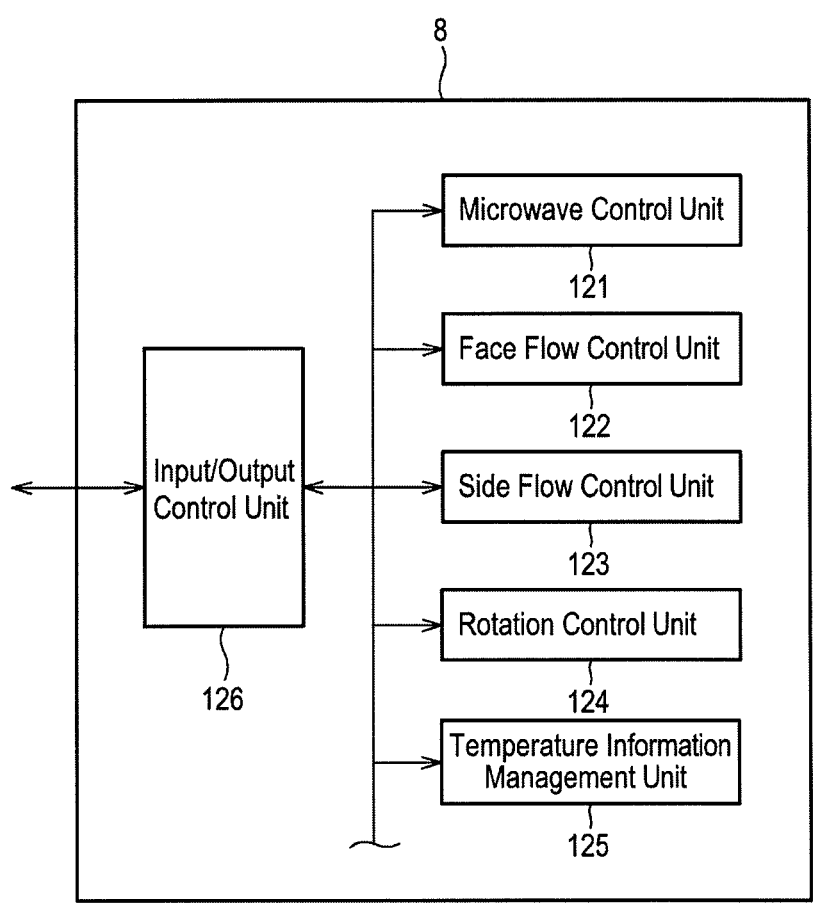
FIG. 5 is a functional block diagram showing a functional configuration of the control unit.

Then, referring to FIG. 5, the functional configuration of the control unit 8 will be described. FIG. 5 is a functional block diagram partially showing a functional configuration of the control unit 8. In the following description, since the hardware configuration of the control unit 8 is as shown in FIG. 4, reference is also made to the reference numerals in FIG. 4. As shown in FIG. 5, the control unit 8 includes a microwave control unit 121, a face flow control unit 122 as a first flow rate control unit, a side flow control unit 123 as a second flow rate control unit, a rotation control unit 124, a temperature information management unit 125, and an input/output control unit 126. Functions of the respective control units are realized as the CPU 111 uses the RAM 112 as a work area and executes the program stored in the ROM 113 or the memory device 105.

The microwave control unit 121 controls on/off switching of the microwave output, an amplitude of the output or the like by transmitting a control signal to the microwave introduction device 3 based on a recipe, parameters or the like previously stored in the memory device 105, thereby controlling a desired heat treatment to be performed in the microwave heat treatment apparatus 1. In addition, referring to the temperatures at the plurality of locations of the wafer W measured by the temperature measurement part 27 in real time, the microwave control unit 121 may perform feedback control to variably adjust the microwave output supplied by the microwave introduction device 3.

The face flow control unit 122 transmits control signals to the gas supply device 50, the opening/closing valves 53A and 53B and the mass flow controllers (MFCs) 52A and 52B of the gas supply mechanism 5 based on the recipe, the parameters or the like previously stored in the memory device 105. Accordingly, the face flow control unit 122 controls an on/off switching timing and a flow rate of the cooling gas supplied into the processing vessel 2 from the gas supply device 50 through the pipes 51A and 51B and the shower head 60, a flow rate ratio between the cooling gas from the pipe 51A and the cooling gas from the pipe 51B, and the like. Referring to the temperatures at the plurality of locations of the wafer W measured by the temperature measurement part 27 in real time, the face flow control unit 122 may perform feedback control to variably adjust an on/off switching timing, a flow rate and the like of the cooling gas supplied from the shower head 60.

The side flow control unit 123 transmits control signals to the gas supply device 50, the opening/closing valve 53C and the mass flow controller (MFC) 52C of the gas supply mechanism 5 based on the recipe, the parameters or the like previously stored in the memory device 105. Accordingly, the side flow control unit 123 controls an on/off switching timing and a flow rate of the cooling gas supplied into the processing vessel 2 from the gas supply device 50 through the pipe 51C and the gas introduction port 12b, and the like. Referring to the temperatures at the plurality of locations of the wafer W measured by the temperature measurement part 27 in real time, the side flow control unit 123 may perform feedback control to variably adjust an on/off switching timing, a flow rate and the like of the cooling gas supplied from the gas introduction port 12b.

The rotation control unit 124 transmits a control signal to the rotary driving part 17 of the support device 4 based on the recipe, the parameters or the like previously stored in the memory device 105, to control an on/off switching of the rotation of the support pins 16 and the rotational speed of the wafer W.

Referring to the temperatures at the plurality of locations of the wafer W measured by the temperature measurement part 27 in real time, the temperature information management unit 125 performs an arithmetic operation or determination based on the temperature information. For example, the temperature information management unit 125 calculates an average of temperatures measured at a plurality of locations in the central portion of the wafer W, or an average of temperatures measured at a plurality of locations in the edge portion of the wafer W. In addition, the temperature information management unit 125 calculates a difference between the average of the temperatures measured in the edge portion of the wafer W and the average of the temperatures measured in the central portion of the wafer W, or compares the calculated result with a predetermined threshold value set in advance.

The input/output control unit 126 performs the input control from the input device 102, the output control to the output device 103, the display control in the display device 104, or the input/output control of data and the like with the outside performed through the external interface 106.

In the microwave heat treatment apparatus 1 having the above-described configuration, since the face flow from the shower head 60 and the side flow from the gas introduction port 12b can be combined to introduce the cooling gas into the processing vessel 2, a variation in an in-plane heating temperature of the wafer W can be restrained to perform a uniform heat treatment.

<Processing Sequence>

A sequence of the microwave heat treatment acts in which an annealing process is performed on the wafer W in the microwave heat treatment apparatus 1 will be described. First, for example, instructions to perform the annealing process in the microwave heat treatment apparatus 1 are input from the input device 102 of the control unit 8. Then, the main control unit 101 receives the instructions and reads the recipe stored in the memory device 105 or the computer-readable storage medium 115. Then, in order to perform the annealing process according to the conditions based on the recipe, the control signals are transmitted from the main control unit 101 to the respective end devices (for example, the microwave introduction device 3, the support device 4, the gas supply device 50, the exhaust device 6 and the like) of the microwave heat treatment apparatus 1.

Next, the gate valve GV is opened, and the wafer W is loaded into the processing vessel 2 through the gate valve GV and the loading/unloading port 12a, and is mounted on the plurality of support pins 16 by a transfer device (not shown). The plurality of support pins 16 are moved in the vertical direction along with the shaft 14 and the arm portion 15 by driving the elevation driving part 18 to set the wafer W at a predetermined level. At this level, by driving the rotary driving part 17 under the control of the rotation control unit 124, the wafer W is horizontally rotated at a predetermined speed. The rotation of the wafer W may not be continuous but discontinuous. Then, the gate valve GV is closed, and if necessary, the interior of the processing vessel 2 may be vacuum-exhausted by the exhaust device 6. Then, the cooling gas is introduced into the processing vessel 2 from the gas supply device 50 through the shower head 60 and the gas introduction port 12b. The internal space of the processing vessel 2 is adjusted to a predetermined pressure by adjusting the exhaust amount and the supply amount of the cooling gas.

Next, under the control of the microwave control unit 121, microwaves are generated by applying a voltage to the magnetrons 31 from the high voltage power supply part 40. The microwaves generated in the magnetrons 31 are propagated through the waveguides 32 and also transmitted through the transmission windows 33 to be introduced into a space above the wafer W rotating in the processing vessel 2. In the present embodiment, the plurality of magnetrons 31 sequentially generates the microwaves, and the microwaves are introduced into the processing vessel 2 from the respective microwave introduction ports 10 in turn. Alternatively, the plurality of magnetrons 31 simultaneously generates a plurality of microwaves, and the microwaves may be simultaneously introduced into the processing vessel 2 from the respective microwave introduction ports 10.

The rotating wafer W is irradiated with the microwaves introduced into the processing vessel 2, so that the wafer W is rapidly heated by electromagnetic wave heating such as Joule heating, magnetic heating, and induction heating. As a result, the wafer W is subjected to an annealing process. During the annealing process, the cooling gas is injected from the shower head 60 and the gas introduction port 12b at independent flow rates by the control of the control unit 8. For example, the cooling gas is injected toward the main surface of the wafer W from the shower head 60 at a predetermined flow rate to form a face flow (down flow) by the control of the face flow control unit 122. In this case, the cooling gas may be injected only to the central portion of the wafer W from the plurality of gas holes 61A at a predetermined flow rate or only to the edge portion of the wafer W from the plurality of gas holes 61B at a predetermined flow rate. Alternatively, the cooling gas may be injected simultaneously from the plurality of gas holes 61A and 61B at independent flow rates. In addition, the cooling gas is injected toward the wafer W from the gas introduction port 12b through the plurality of gas injection holes 63a of the shower plate 63 in a direction parallel to the main surface of the wafer W at a predetermined flow rate to form a side flow by the control of the side flow control unit 123. The direction parallel to the main surface of the wafer W means that when the gas flow is represented by vectors, a component parallel to the main surface of the wafer W is dominant (about 50% or more). Thus, the gas flow containing a component not parallel to the main surface of the wafer W in some degree is also included in the "parallel" gas flow.

The flow rate of the cooling gas in the face flow from the shower head 60 and the flow rate of the cooling gas in the side flow from the gas introduction port 12b may be the same as or different from each other. For example, a flow rate ratio between the face flow and the side flow (face flow:side flow) may be set to fall within a range of 1:10 to 10:1, and in some embodiments, 1:3 to 3:1. In this case, in order to increase the cooling efficiency in the vicinity of the center of the wafer W, it is effective to increase the proportion of the face flow. Particularly, it is effective to increase the flow rate of the cooling gas injected toward the central portion of the wafer W from the gas holes 61A. In contrast, in order to increase the cooling efficiency in the vicinity of the edge of the wafer W, it is effective to increase the proportion of the side flow. In this way, it is possible to restrain an excessive rise in the temperature of the wafer W and to perform the process considering a balance between the cooling and the heating in the plane of the wafer W.

Also, by rotating the wafer W during the annealing process, a bias of the microwave irradiated to the wafer W is reduced to make the in-plane heating temperature distribution of the wafer W uniform. In addition, by rotating the wafer W, the cooling gas from the shower head 60 and the gas introduction port 12b can be injected to the wafer W without being biased. Accordingly, the temperature can be adjusted such that the in-plane temperature distribution of the wafer W is made uniform. In the microwave heat treatment apparatus 1 of the present embodiment, since the ceiling portion 11 has the plurality of microwave introduction ports 10 where no gas holes can be formed, it is also effective to rotate the wafer W in view of performing the uniform cooling in the plane of the wafer W. In addition, during the annealing process, the support device 4 may change the level position of the wafer W.

If the main control unit 101 transmits a control signal for terminating the annealing process to the respective end devices of the microwave heat treatment apparatus 1, the generation of microwaves is stopped, the rotation of the wafer W is stopped, and the supply of the cooling gas is stopped, so that the annealing process on the wafer W is terminated.

Also, after the termination of the annealing process, by continuing to introduce the cooling gas from the shower head 60 and the gas introduction port 12b in the state that the wafer W is maintained on the support pins 16, the wafer W may be subjected to a cooling process. By introducing the cooling gas, the cooling of the wafer W can be promoted. In addition, during the cooling process, by rotating the wafer W using the support device 4, the wafer W can be cooled while making the in-plane temperature distribution of the wafer W uniform.

After the annealing or cooling process for a predetermined time is terminated, the gate valve GV is opened, the level position of the wafer W is adjusted by the support device 4, and the wafer W is then unloaded by the transfer device (not shown).

The microwave heat treatment apparatus 1 can be used in a process of manufacturing semiconductor devices, for example, for the purpose of an annealing process for activating doped atoms implanted into a diffusion layer.

<Control Sequence of Side Flow>

Two representative examples of side flow control in an annealing process, wherein the in-plane temperature distribution of the wafer W is made uniform by combining the face flow and the side flow of the cooling gas, using the microwave heat treatment apparatus 1 will be described. Here, an example of continuously performing the side flow (hereinafter, simply referred to as a first example) while increasing or decreasing the flow rate according to the in-plane temperature distribution of the wafer W based on temperature measurement information of the wafer W and an example of intermittently performing the side flow (hereinafter, simply referred to as a second example) will be described. Also, in both the first and second examples, the face flow from the shower head 60 is performed at a constant flow rate through all the gas holes 61A and 61B.

First Example

Figure 6:
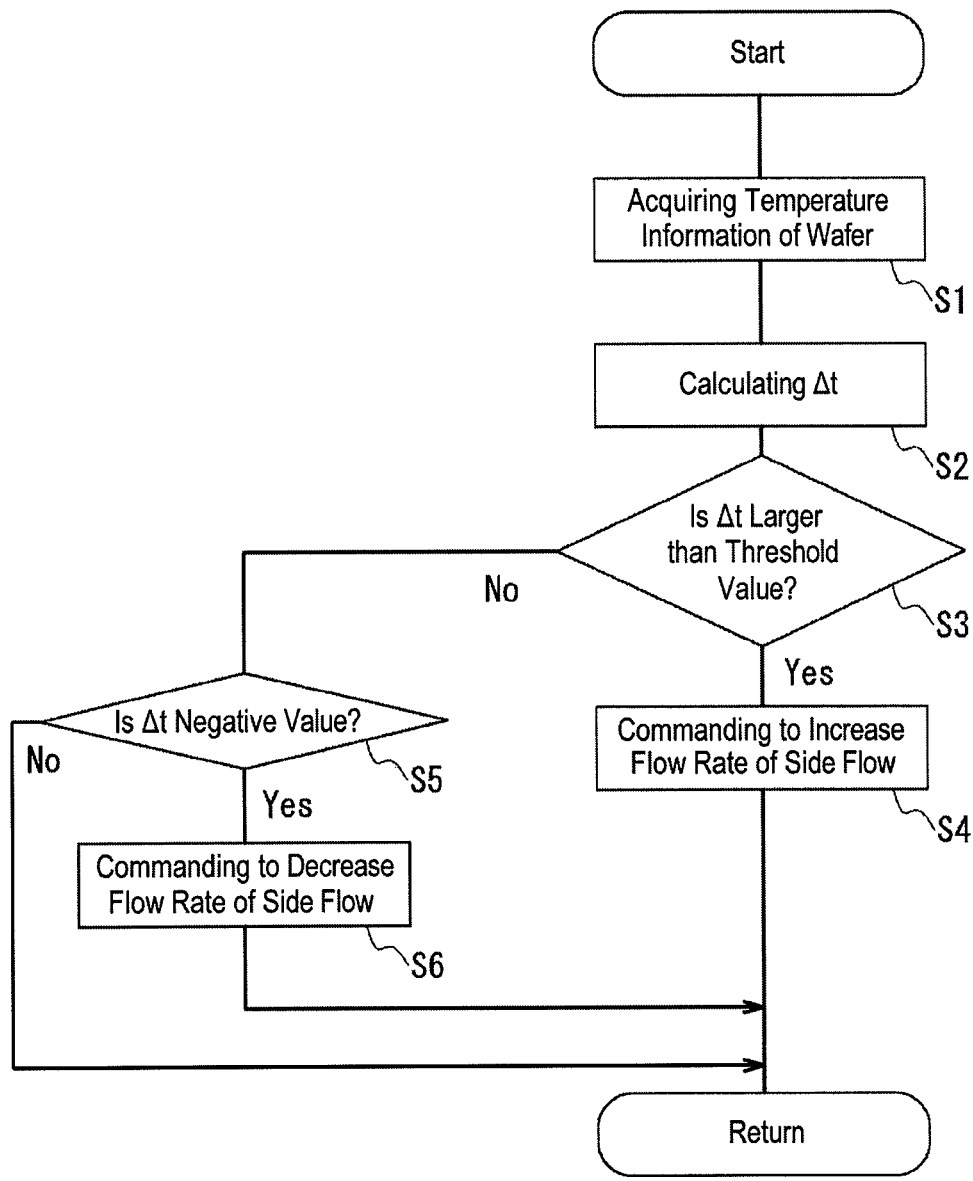
FIG. 6 is a flowchart illustrating an example of a control sequence of a side flow performed in the control unit.

FIG. 6 is a flowchart illustrating a side flow control sequence performed in the control unit 8 in the first example. The first example includes a sequence of Steps S1 to S6.

First, as a premise, as described in the above processing sequence, an annealing process using a microwave is performed on the wafer W using the microwave heat treatment apparatus 1. In the beginning of the annealing process, based on the recipe, the parameters or the like previously stored in the memory device 105, the introduction of the cooling gas by the face flow from the shower head 60 and the introduction of the cooling gas by the side flow from the gas introduction port 12b are performed at respective predetermined flow rates. In the first example, during the annealing process, the sequence shown in FIG. 6 is repeatedly performed in the control unit 8. The sequence shown in FIG. 6 is terminated along with the termination of the annealing process.

In Step S1, the temperature information management unit 125 of the control unit 8 acquires the temperature information of the wafer W measured in the temperature measurement part 27. Here, the temperature information of the wafer W may include the temperatures measured at the plurality of locations in the wafer W, and averages of the measured temperatures in the respective regions in the wafer W.

In Step S2, the temperature information management unit 125 performs arithmetic operations to calculate a difference $\Delta t$ between an average measured temperature t1 in the central portion of the wafer W and an average measured temperature t2 in the edge portion of the wafer W. Here, $\Delta t$ means a difference, t2−t1 (the same is true in the later-described second example). Therefore, a positive value of $\Delta t$ means that the average temperature of the edge portion of the wafer W is higher than that of the central portion, and a negative value of $\Delta t$ means that the average temperature of the edge portion of the wafer W is lower than that of the central portion.

Next, in Step S3, the temperature information management unit 125 compares $\Delta t$ with a predetermined threshold value set in advance and then determines whether or not $\Delta t$ is larger than the threshold value. Here, the threshold value is a value that is set according to conditions such as a size of the wafer W, an objective of the annealing process, and a set annealing temperature. As the threshold value, a value which has been stored in the memory device 105 or the storage medium 115 of the control unit 8 may be referred to by the temperature information management unit 125, or a value which has been input through the input device 102 by a process manager may be used.

If it is determined in Step S3 that Δt is larger than the threshold value ("Yes"), a command signal to increase the flow rate of the side flow is transmitted from the side flow control unit 123 to the gas supply mechanism 5 in Step S4. If Δt is larger than the threshold value ("Yes"), it means that in the plane of the wafer W, the temperature of the edge portion rises in excess of an allowable range beyond the temperature of the central portion. For that reason, in order to actively cool the edge portion, the flow rate of the cooling gas by the side flow is increased in Step S4. In this case, the flow rate may be increased by an absolute value set in advance, or may be increased at an increasing rate based on the flow rate at that time. In addition, the absolute value or the increasing rate may be set in stages. The absolute value or the increasing rate may be stored, for example, in the memory device 105 or the storage medium 115 of the control unit 8, as a part of the recipe.

If it is determined in Step S3 that Δt is not larger than the threshold value ("No"), the temperature information management unit 125 determines whether or not Δt is a negative value in Step S5. If it is determined in Step S5 that Δt is a negative value ("Yes"), it means that the average temperature in the edge portion of the wafer W is lower than that in the central portion. For that reason, in next Step S6, in order to promote a rise in the temperature of the edge portion, a command signal to decrease the flow rate of the cooling gas by the side flow is transmitted from the side flow control unit 123 to the gas supply mechanism 5. In this case, the flow rate may be decreased by an absolute value set in advance, or may be decreased at a decreasing rate based on the flow rate at that time. In addition, the absolute value or the decreasing rate may be set in stages. The absolute value or the decreasing rate may be stored, for example, in the memory device 105 or the storage medium 115 of the control unit 8, as a part of the recipe.

If it is determined in Step S5 that Δt is not a negative value ("No"), considering Step S3, it means that the temperature difference between the central portion and the edge portion in the plane of the wafer W falls within an allowable range. Accordingly, the flow rate of the side flow is not changed.

As described above, in the first example, by repeatedly performing the sequence shown in FIG. 6 in the control unit 8 during the annealing process, the flow rate of the side flow is increased or decreased according to the measured temperatures in the plane of the wafer W. With this configuration, as the face flow from the shower head 60 and the side flow from the gas introduction port 12b are combined, the uniformity of the in-plane temperature distribution of the wafer W can be obtained.

Second Example

Figure 7:
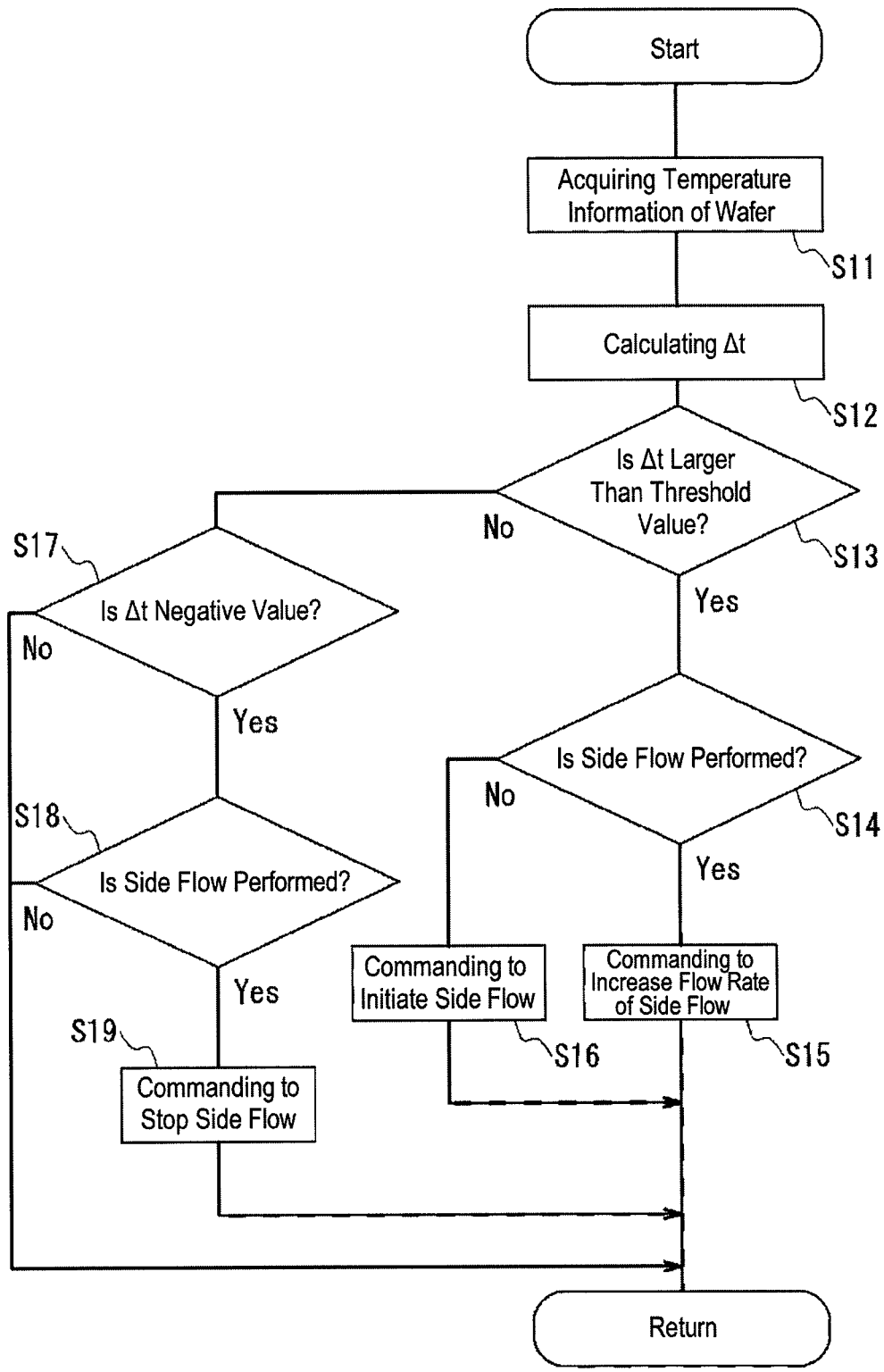
FIG. 7 is a flowchart illustrating another example of the control sequence of the side flow performed in the control unit.

FIG. 7 is a flowchart illustrating a side flow control sequence performed in the control unit 8 in the second example. The second example includes a sequence of Steps S11 to S19.

First, as a premise, as described in the above processing sequence, an annealing process using a microwave is performed on the wafer W using the microwave heat treatment apparatus 1. In the beginning of the annealing process, based on the recipe, the parameters or the like previously stored in the memory device 105, only the introduction of the cooling gas by the face flow from the shower head 60 at a predetermined flow rate is performed. In the second example, during the annealing process, the sequence shown in FIG. 7 is repeatedly performed in the control unit 8. The sequence shown in FIG. 7 is terminated along with the termination of the annealing process.

Since Steps S11 to S13 of FIG. 7 are the same as Steps S1 to S3 of the first example, the description thereof will be omitted.

If it is determined in step S13 that Δt is larger than the threshold value ("Yes"), it means that in the plane of the wafer W, the temperature of the edge portion rises in excess of an allowable range beyond the temperature of the central portion. Then, in Step S14, referring to the information from the side flow control unit 123, it is determined whether or not the side flow is performed. If it is determined in Step S14 that the side flow is performed ("Yes"), in order to more actively cool the edge portion, in the next Step S15, a command signal to increase the flow rate of the side flow is transmitted from the side flow control unit 123 to the gas supply mechanism 5. In this case, the flow rate may be increased by an absolute value set in advance, or may be increased at an increasing rate based on the flow rate at that time. In addition, the absolute value or the increasing rate may be set in stages. The absolute value or the increasing rate may be stored, for example, in the memory device 105 or the storage medium 115 of the control unit 8, as a part of the recipe.

If it is determined in Step S14 that the side flow is not performed ("No"), in order to more actively cool the edge portion, in the next Step S16, a command signal to initiate the side flow of the cooling gas at a predetermined flow rate is transmitted from the side flow control unit 123 to the gas supply mechanism 5.

Also, if it is determined in Step S13 that Δt is not larger than the threshold value ("No"), the temperature information management unit 125 determines whether or not Δt is a negative value in Step S17. If it is determined in Step S17 that Δt is a negative value ("Yes"), it means that the average temperature of the edge portion of the wafer W is lower than that of the central portion. For that reason, in Step S18, referring to the information from the side flow control unit 123, it is determined whether or not the side flow is performed. If it is determined in Step S18 that the side flow is performed ("Yes"), in order to promote a rise in the temperature of the edge portion, a command signal to stop the side flow of the cooling gas is transmitted from the side flow control unit 123 to the gas supply mechanism 5 in Step S19.

If it is determined in Step S17 that Δt is not a negative value ("No"), considering Step S13, it means that the temperature difference between the central portion and the edge portion in the plane of the wafer W is in the allowable range. Accordingly, the current situation is maintained regardless of whether or not the side flow is performed. If it is determined in Step S18 that side flow is not performed ("No"), it means that the average temperature of the edge portion of the wafer W is lower than that of the central portion even though the side flow is not performed. However, since such situation is not a subject of the present sequence, the current situation is maintained. In this case, although it is effective to additionally perform a face flow control by the face flow control unit 122, for example, stopping the introduction or restraining the flow rate of the cooling gas from the plurality of gas holes 61B of the shower head 60, details will be omitted here.

As described above, in the second example, by repeatedly performing the sequence shown in FIG. 7 in the control unit 8 during the annealing process, the side flow is on/off switched according to the measured temperatures in the plane of the wafer W. With this configuration, as the face flow from the shower head 60 and the side flow from the gas introduction port 12b are combined at appropriate timings, the uniformity of the in-plane temperature distribution of the wafer W can be obtained.

The microwave heat treatment method of the present embodiment may include the side flow control sequence of the first or second example. Further, in Step S3 of the first example and Step S13 of the second example, a predetermined range (absolute value) including a negative value may be set in advance instead of the predetermined threshold value, and the determination may be made based on whether or not Δt exceeds the upper limit of the range. In this case, in Step S5 of the first example and Step S17 of the second example, the determination may be made based on whether or not Δt is below the lower limit of the range.

As described above, in the microwave heat treatment apparatus 1 and the microwave heat treatment method of the present embodiment, the cooling of the wafer W using the cooling gas may be performed while the annealing process is performed by irradiating the wafer W with microwaves. In addition, the cooling of the wafer W using the cooling gas can promote uniformity of the in-plane temperature distribution of the wafer W by combining the face flow from the shower head 60 and the side flow from the gas introduction port 12b. Further, in the microwave heat treatment apparatus 1 and the microwave heat treatment method of the present embodiment, after the annealing process, the cooling process of the wafer W using the cooling gas may be performed in the processing vessel 2. By performing the cooling process after the annealing process, it is possible to rapidly perform a subsequent process of the wafer W that was subjected to the annealing process, which improves the throughput of processing a plurality of wafers W while replacing the wafers W.

Experimental Example 1

Below, an experimental example through which the effects of the present disclosure were confirmed will be described. Using a microwave heat treatment apparatus having the same configuration as the microwave heat treatment apparatus 1 of FIG. 1, the annealing process was performed on a wafer W having a diameter of 300 mm. During the annealing process, an $N_2$ gas as the cooling gas was introduced into the processing vessel 2 by two methods. For each of the two methods, the temperature measurement part 27 measured temperatures at a plurality of locations in the central and edge portions of the wafer W and calculated the average temperature of the central portion of the wafer W and the average temperature of the edge portion of the wafer W. The two methods of introducing the cooling gas include Method 1 in which only the face flow at a total flow rate of 30 L/min (SLM) from the gas holes 61A and 61B of the shower head 60 was performed, and Method 2 in which the side flow at a flow rate of 20 L/min (SLM) from the gas introduction port 12b was combined with the face flow at the total flow rate of 30 L/min (SLM) in the same manner as Method 1. The result is shown in Table 1 and FIG. 8. In addition, the vertical axis of FIG. 8 represents a relative temperature difference between the average of the central portion and the average of the edge portion of the wafer W, and the horizontal axis represents a coordinate in the diameter direction with the center of the wafer W being zero.

TABLE 1

|  | Method 1 | Method 2 |
| --- | --- | --- |
| Flow rate ratio [L/min (SLM)] (face flow/side flow) | 30/0 | 30/20 |
| Temperature in central portion [degrees C.] | 820.6 | 803.5 |
| Temperature in edge portion [degrees C.] | 839.3 | 812.4 |
| Temperature difference Δt between central portion and edge portion | 18.7 | 8.9 |

Figure 8:
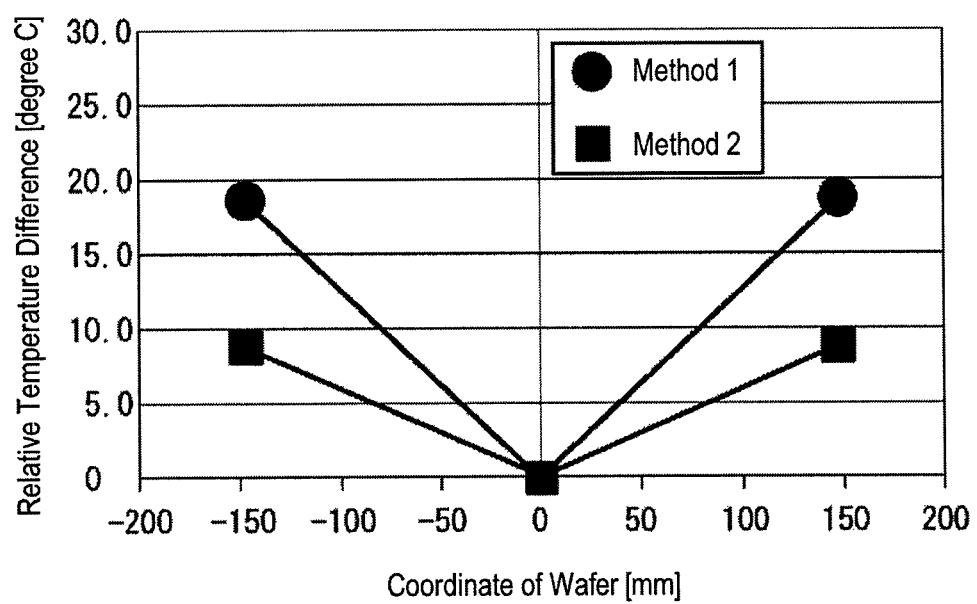
FIG. 8 is a graph showing an in-plane temperature distribution of a wafer in Experimental Example 1.

From Table 1 and FIG. 8, in Method 1 using only the face flow, the temperature of the edge portion of the wafer W was higher than the central portion, which means that a variation in the in-plane temperature distribution of the wafer W was large. By comparison, in Method 2 combining the face flow and the side flow, the temperature of the edge portion was close to the temperature of the central portion, and thus it was confirmed that the in-plane heating temperature of the wafer W could be made more uniform in Method 2.

Experimental Example 2

Figure 9:
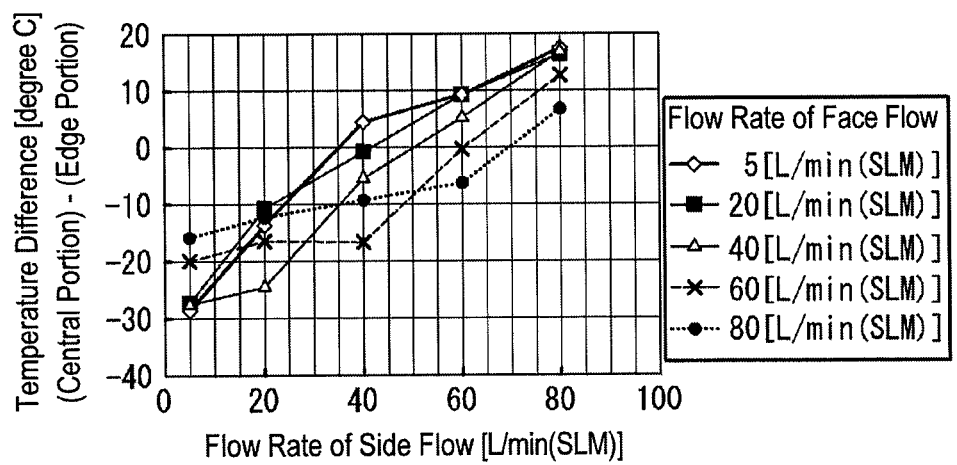
FIG. 9 is a graph showing a relationship between a temperature difference in a wafer plane and flow rates of the face and side flows in Experimental Example 2.

Using a microwave heat treatment apparatus having the same configuration as the microwave heat treatment apparatus 1 of FIG. 1, the annealing process was performed on a wafer W having a diameter of 300 mm. In the annealing process, while supplying a microwave of 3900 W in total, an $N_2$ gas as the cooling gas was introduced into the processing vessel 2 by the face flow and the side flow. Each of the flow rates of the face flow and the side flow was changed within a range of 5 L/min (SLM) to 80 L/min (SLM). Specifically, the flow rate of the cooling gas by each of the face and side flows was set to 5 L/min (SLM), 20 L/min (SLM), 40 L/min (SLM), 60 L/min (SLM) or 80 L/min (SLM). In addition, the flow rate of the face flow is a total of flow rates from the gas holes 61A and 61B of the shower head 60. During the annealing process, the temperature measurement part 27 measured temperatures at the plurality of locations in the central and edge portions of the wafer W, and calculated the average temperature of the central portion and the average temperature of the edge portion. The result is shown in FIG. 9. The vertical axis of FIG. 9 represents a difference in the measured temperature between the central portion and the edge portion of the wafer W (central portion temperature–edge portion temperature), and the horizontal axis represents the flow rate of the cooling gas by the side flow.

Figure 10:
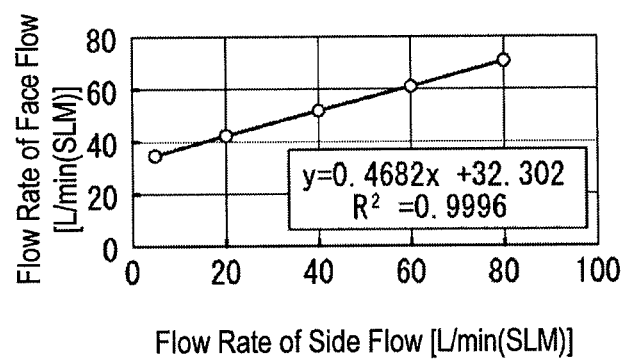
FIG. 10 is a graph showing flow rate conditions of the face and side flows, under which the temperature difference in the wafer plane is minimized, in Experimental Example 2.

FIG. 10 shows conditions, which are obtained using the result of Experimental Example 2, under which the difference in temperature between the central portion and the edge portion of the wafer W (central portion temperature–edge portion temperature) approaches zero. In FIG. 10, the vertical axis (y axis) represents the flow rate of the face flow and the horizontal axis (x axis) represents the flow rate of the side flow. From FIG. 10, it was confirmed that the in-plane temperature distribution of the wafer W could be minimized by adjusting the flow rates of the face flow and the side flow under the conditions which met the following equation (1):

$$y=0.4682x+32.302 \quad (1)$$

(Correlation Coefficient $R_2$=0.9996).

In the annealing process, generally, non-uniformity of the in-plane temperature distribution of the wafer W tends to occur due to a standing wave generated by the microwaves introduced into the processing vessel 2. However, from the result of FIGS. 9 and 10, it was confirmed that a variation in the in-plane temperature distribution of the wafer W could be effectively restrained by appropriately adjusting the flow rates of the face flow and the flow rate.

The present disclosure is not limited to the above-described embodiment, and various modifications may be made. For example, the microwave heat treatment apparatus of the present disclosure is not limited to the case where the semiconductor wafer is used as the substrate, and may also be applied, for example, to a microwave heat treatment apparatus in which a substrate of a solar cell panel or a substrate for a flat panel display is used as the substrate.

Further, although in the microwave heat treatment apparatus 1, the shower head 60 as the first cooling gas introduction part is embedded and mounted in the ceiling portion 11, the shower head may be configured as, for example, an independent member disposed to be spaced apart from the ceiling portion 11. In addition, a shower plate may be used instead of the shower head 60.

In addition, the number of microwave units 30 (the number of the magnetrons 31) or the number of microwave introduction ports 10 in the microwave heat treatment apparatus is not limited to the number described in the above-described embodiment.

According to the microwave heat treatment apparatus and the microwave heat treatment method of the present disclosure, it is possible to perform a heat treatment with improved uniformity of in-plane temperature distribution of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A microwave heat treatment apparatus, comprising:
    a processing vessel configured to accommodate a substrate therein;
    a support member configured to rotatably support the substrate in the processing vessel;
    a microwave introduction device configured to generate a microwave for processing the substrate and introduce the microwave into the processing vessel;
    a first cooling gas introduction part installed at a position facing a main surface of the substrate supported by the support member, the main surface being a target to be processed, and configured to inject a cooling gas from the position facing the main surface of the substrate toward the main surface of the substrate so as to form a first cooling gas flow;
    a second cooling gas introduction part installed at a lateral side of the substrate supported by the support member, and configured to inject the cooling gas from the lateral side of the substrate in a direction parallel with the main surface of the substrate so as to form a second cooling gas flow;
    a plurality of radiation thermometers configured to measure temperatures at a plurality of locations of the substrate; and
    a controller configured to independently control introduction of the cooling gas from the first cooling gas introduction part and introduction of the cooling gas from the second cooling gas introduction part,
    wherein the controller performs a control to:
        calculate a difference $\Delta t$ between an average of the measured temperatures at a central portion of the substrate and an average of the measured temperatures at an edge portion of the substrate;
        determine whether to increase a flow rate of the second cooling gas flow or to decrease the flow rate of the second cooling gas flow based on the difference $\Delta t$; and
        adjust a flow rate of the first cooling gas flow and the flow rate of the second cooling gas flow under a condition in which the adjusted flow rate of the first cooling gas flow and the adjusted flow rate of the second cooling gas flow satisfy a predetermined formula.

2. The microwave heat treatment apparatus of claim 1, wherein the first cooling gas introduction part includes a plurality of gas injection holes formed in an upper wall of the processing vessel.

3. The microwave heat treatment apparatus of claim 2, wherein the first cooling gas introduction part is configured to independently inject the cooling gas to a central portion and an edge portion of the main surface of the substrate.

4. The microwave heat treatment method of claim 1, wherein the second cooling gas introduction part includes a gas introduction port formed in a sidewall of the processing vessel.

5. The microwave heat treatment method of claim 4, wherein a gas dispersion plate having a plurality of through holes is installed between the gas introduction port and the substrate supported by the support member, so as to define a diffusion space, in which the cooling gas introduced from the second cooling gas introduction part is diffused, between the gas dispersion plate and the sidewall of the processing vessel.

6. The microwave heat treatment apparatus of claim 1, wherein the predetermined formula includes the flow rate of the first cooling gas flow and the flow rate of the second cooling gas flow as variables and represents a relationship between the flow rate of the first cooling gas flow and the flow rate of the second cooling gas flow, in which the difference $\Delta t$ approaches zero.

7. The microwave heat treatment apparatus of claim 6, wherein the predetermined formula is $y=0.4682x+32.302$, where x denotes the flow rate of the second cooling gas flow and y denotes the flow rate of the first cooling gas flow.

8. The microwave heat treatment apparatus of claim 1, wherein the controller further performs a control to increase the flow rate of the second cooling gas flow when the difference $\Delta t$ is larger than a threshold value.

9. The microwave heat treatment apparatus of claim 1, wherein the controller further performs a control to initiate the second cooling gas flow when the difference $\Delta t$ is larger than a threshold value and no cooling gas is injected from the second cooling gas introduction part.

10. The microwave heat treatment apparatus of claim 1, wherein the controller further performs a control to decrease the flow rate of the second cooling gas flow when the difference $\Delta t$ is a negative value.

11. The microwave heat treatment apparatus of claim 1, wherein the controller further performs a control to stop the second cooling gas flow when the difference $\Delta t$ is a negative value and the cooling gas is injected from the second cooling gas introduction part.

* * * * *